United States Patent
Jin

(10) Patent No.: US 9,672,923 B1
(45) Date of Patent: *Jun. 6, 2017

(54) LOW POWER HIGH SPEED PROGRAM METHOD FOR MULTI-TIME PROGRAMMABLE MEMORY DEVICE

(71) Applicant: Integrated Silicon Solution, Inc., Milpitas, CA (US)

(72) Inventor: Kyoung Chon Jin, San Ramon, CA (US)

(73) Assignee: Integrated Silicon Solution, Inc., Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/365,575

(22) Filed: Nov. 30, 2016

Related U.S. Application Data

(63) Continuation of application No. 14/869,820, filed on Sep. 29, 2015, now Pat. No. 9,543,016.

(51) Int. Cl.
| | | |
|---|---|---|
| *G11C 16/10* | (2006.01) | |
| *G11C 16/26* | (2006.01) | |
| *G11C 16/30* | (2006.01) | |
| *G11C 16/04* | (2006.01) | |
| *G11C 16/34* | (2006.01) | |
| *H01L 27/11524* | (2017.01) | |
| *H01L 27/11529* | (2017.01) | |
| *H01L 23/528* | (2006.01) | |
| *H01L 29/788* | (2006.01) | |

(52) U.S. Cl.
CPC ......... *G11C 16/10* (2013.01); *G11C 16/0425* (2013.01); *G11C 16/0483* (2013.01); *G11C 16/26* (2013.01); *G11C 16/30* (2013.01); *G11C 16/345* (2013.01); *G11C 16/3459* (2013.01); *H01L 23/528* (2013.01); *H01L 27/11524* (2013.01); *H01L 27/11529* (2013.01); *H01L 29/7884* (2013.01)

(58) Field of Classification Search
None
See application file for complete search history.

(56) References Cited

U.S. PATENT DOCUMENTS

| | | |
|---|---|---|
| 7,542,342 B2 | 6/2009 | Kalnitsky |
| 8,315,100 B2 | 11/2012 | Haggag |

(Continued)

OTHER PUBLICATIONS

David Hsu "The first CMOS embedded MTP NNVM IP in 40nm—Itera" EE Times, Apr. 26, 2011, http://www.eetimes.com/document.asp?doc_id=1278739, retrieved Jul. 27, 2015.

*Primary Examiner* — James G Norman
(74) *Attorney, Agent, or Firm* — Van Pelt, Yi & James LLP

(57) ABSTRACT

A programming method for a PMOS multi-time programmable (MTP) flash memory device biases the select gate transistor to a constant drain current level and sweeps the control gate bias voltage from a low voltage level to a high voltage level while maintaining the cell current around a predetermined cell current limit level. In this manner, the PMOS MTP flash memory device can achieve low power and high speed program using hot carrier injection (HCI). The programming method of the present invention enables multi-bit programming of the PMOS MTP flash memory cells, thereby increasing the programming speed while preserving low power consumption.

15 Claims, 11 Drawing Sheets

(56) References Cited

U.S. PATENT DOCUMENTS 8,472,251 B2 6/2013 Lee
2010/0074014 A1* 3/2010 Dunga .................... G11C 7/04
 365/185.17

* cited by examiner

Fig. 5

Conventional Cell Bias Condition for Program Operation

<table>
<tr><td colspan="2">Program</td><td colspan="5">Selected BL</td><td colspan="5">Un-Selected BL</td></tr>
<tr><td colspan="2">Node</td><td>BL</td><td>SG</td><td>CG</td><td>SL</td><td>Well</td><td>BL</td><td>SG</td><td>CG</td><td>SL</td><td>Well</td></tr>
<tr><td rowspan="4">Selected SG</td><td>Step1</td><td rowspan="4">VPP(6V)</td><td rowspan="4">VDD (2V)</td><td>3V</td><td rowspan="4">0V</td><td rowspan="4">VPP(6V)</td><td rowspan="4">Float</td><td rowspan="4">VDD (2V)</td><td>3V</td><td rowspan="4">Float</td><td rowspan="4">VPP(6V)</td></tr>
<tr><td>Step2</td><td>4V</td><td>4V</td></tr>
<tr><td>Step3</td><td>5V</td><td>5V</td></tr>
<tr><td>Step4</td><td>6V</td><td>6V</td></tr>
<tr><td colspan="2">Node</td><td>BL</td><td>SG</td><td>CG</td><td>SL</td><td>Well</td><td>BL</td><td>SG</td><td>CG</td><td>SL</td><td>Well</td></tr>
<tr><td colspan="2">Un-Selected SG</td><td>VPP(6V)</td><td>VPP(6V)</td><td>3V</td><td>0V</td><td>VPP(6V)</td><td>Float</td><td>VPP(6V)</td><td>3V</td><td>Float</td><td>VPP(6V)</td></tr>
</table>

Fig. 6

PMOS MTP Cell Bias Condition for Program Operation

| Program | | Selected BL | | | | | Un-Selected BL | | | | |
|---|---|---|---|---|---|---|---|---|---|---|---|
| | Node | BL | SG | CG | SL | Well | BL | SG | CG | SL | Well |
| Selected SG | Bias | VPP(6V) | V$_{SG}$(7uA) | 0V~6V | 0V | VPP(6V) | Float | V$_{SG}$(7uA) | 0V~6V | Float | VPP(6V) |
| | Node | BL | SG | CG | SL | Well | BL | SG | CG | SL | Well |
| Un-Selected SG | Bias | VPP(6V) | VPP(6V) | 3V | 0V | VPP(6V) | Float | VPP(6V) | 3V | Float | VPP(6V) |

PMOS MTP Cell Bias Condition for Erase Operation

| Erase | | BL | SG | CG | SL | Well | BL | SG | CG | SL | Well |
|---|---|---|---|---|---|---|---|---|---|---|---|
| | | Selected BL | | | | | Un-Selected BL | | | | |
| Selected SG | Node | BL | SG | CG | SL | Well | BL | SG | CG | SL | Well |
| | Bias | Float | 7.5V | 0V | 7.5V | 7.5V | | | | | |
| Un-Selected SG | Node | BL | SG | CG | SL | Well | BL | SG | CG | SL | Well |
| | Bias | Float | 7.5V | 7.5V | 7.5V | 7.5V | | | | | |

PMOS MTP Cell Bias Condition for Read Operation

| Read | | Selected BL | | | | | Un-Selected BL | | | | |
|---|---|---|---|---|---|---|---|---|---|---|---|
| Selected SG | Node | BL | SG | CG | SL | Well | BL | SG | CG | SL | Well |
| | Bias | 0V | 0V | 0V | VDD (2V) | VDD (2V) | VDD (2V) | 0V | 0V | VDD (2V) | VDD (2V) |
| Un-Selected SG | Node | BL | SG | CG | SL | Well | BL | SG | CG | SL | Well |
| | Bias | 0V | VDD (2V) | 0V | VDD (2V) | VDD (2V) | VDD (2V) | VDD (2V) | 0V | VDD (2V) | VDD (2V) |

Fig. 9

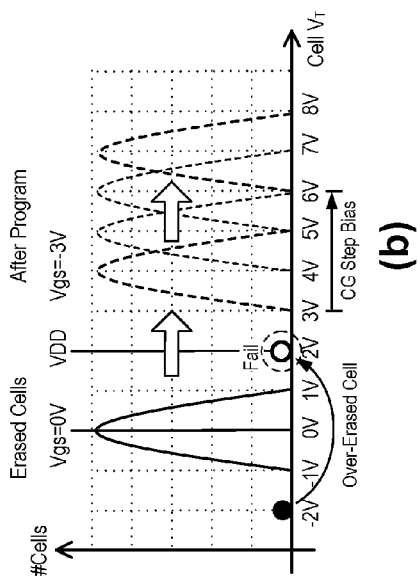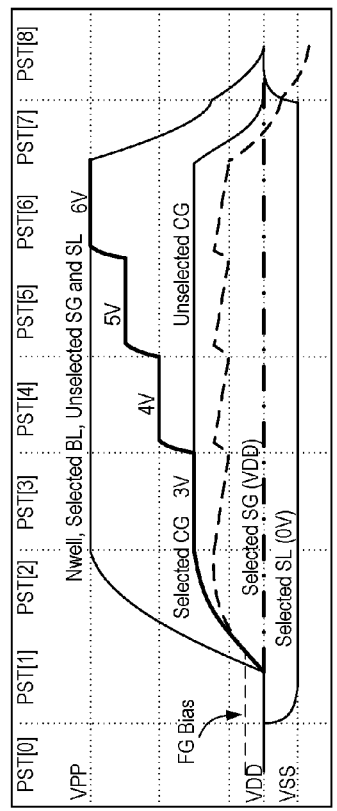
Fig. 12
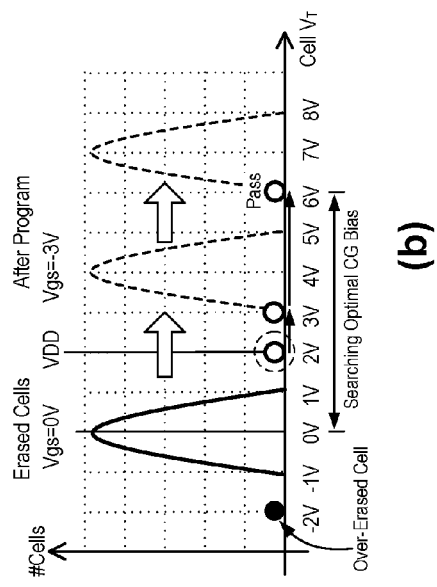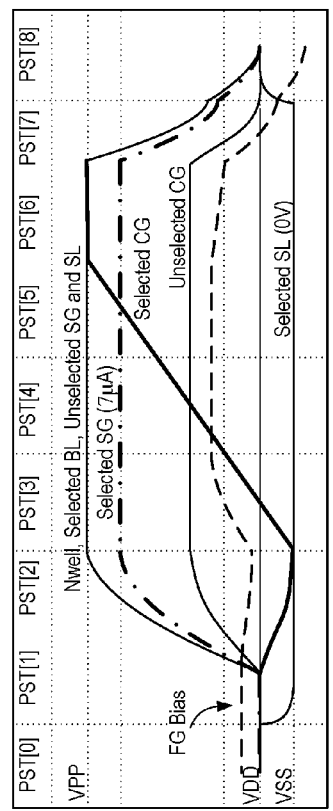
Fig. 13

US 9,672,923 B1

LOW POWER HIGH SPEED PROGRAM METHOD FOR MULTI-TIME PROGRAMMABLE MEMORY DEVICE

CROSS REFERENCE TO OTHER APPLICATIONS

This application is a continuation of co-pending U.S. patent application Ser. No. 14/869,820, entitled LOW POWER HIGH SPEED PROGRAM METHOD FOR MULTI-TIME PROGRAMMABLE MEMORY DEVICE, filed Sep. 29, 2015, now U.S. Pat. No. 9,543,016, issued Jan. 10, 2017, which is incorporated herein by reference for all purposes.

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current.

Flash memory devices constructed using an NMOS double poly flash memory cell have been widely adopted. In a NMOS double poly flash memory cell, a floating gate is formed between a control gate and the channel region (the substrate) of the MOS device and the floating gate is at least partially vertically aligned with the control gate. While the NMOS double poly flash memory cell architecture has been wide applied, the double poly flash memory cell requires special fabrication process to form the two polysilicon layers and is therefore not compatible with standard logic CMOS fabrication processes which often include only a single polysilicon layer.

Multi-time programmable (MTP) flash memory devices that can be fabricated using standard logic CMOS fabrication processes are favored for reduction in manufacturing cost by eliminating the expensive double poly fabrication process. These single polysilicon MTP flash memory cells can be advantageously applied in embedded applications. For example, a PMOS MTP flash memory cell can be formed using a two-transistor cell, including a floating gate, a select gate and a control gate formed in a P-well and capacitively coupled to the floating gate. The PMOS MTP flash memory cell stores charges on the floating gate and support multiple write cycles. PMOS MTP flash memory cells constructed using standard logic CMOS fabrication processes have been shown to provide more than 10-year retention time after one hundred thousand program and erase cycles in system application.

In general, PMOS MTP flash memory cells are programmed using gate induced drain leakage (GIDL). However, there are some limitations with programming of PMOS MTP flash memory cells using GIDL current. First, when the MTP flash memory cells are fabricated using standard logic CMOS processes, the logic transistors are often designed for low power supply voltage (e.g. 1V) and the logic transistors are formed with lightly-doped drain junction structure on the source/drain regions which disturb the GIDL current for programming. Second, the vertical electric field across the thin gate oxide is often not very strong. Accordingly, in some designs, PMOS MTP flash memory cells are programmed using hot carrier injection (HCI). However, when HCI is used for programming, the cell current increases as the programming of the memory cell progresses. With the large cell current during programming (e.g. greater than 80 µA per cell), it is often not possible to perform programming of a byte of data at the same time as device specification often requires low power consumption at low power supply voltage. The programming speed becomes very slow when bit-by-bit programming is used to reduce power consumption.

BRIEF DESCRIPTION OF THE DRAWINGS

Various embodiments of the invention are disclosed in the following detailed description and the accompanying drawings.

FIG. 5 illustrates the memory cell bias condition of a conventional program operation in some examples.

FIG. 6 illustrates the memory cell bias condition used in the programming method for a PMOS MTP flash memory device in embodiments of the present invention.

FIG. 9 illustrates the memory cell bias conditions that can be used to erase and to read the PMOS MTP flash memory cells in embodiments of the present invention.

FIG. 11, which includes

FIG. 12, which includes FIGS. 12(a) and 12(b), illustrates the bias voltages and the threshold voltage shifts of PMOS MTP flash memory cells using the conventional programming method.

FIG. 13, which includes FIGS. 13(a) and 13(b), illustrates the bias voltages and the threshold voltage shifts of PMOS MTP flash memory cells using the programming method in embodiments of the present invention.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In some embodiments of the present invention, a programming method for a PMOS MTP flash memory device biases the select gate transistor to a constant drain current level and sweeps the control gate bias voltage from a low voltage level to a high voltage level while maintaining the cell current around a predetermined cell current limit level. In this manner, the PMOS MTP flash memory device can achieve low power and high speed program using hot carrier injection (HCI). The programming method of the present invention enables multi-bit programming of the PMOS MTP flash memory cells, thereby increasing the programming speed while preserving low power consumption.

In some embodiments, the PMOS MTP flash memory device is implemented using a high endurance MTP array formed using a standard logic CMOS fabrication process. The programming method of the present invention realizes low cell current so that the memory device requires only a small size charge pump. The PMOS MTP flash memory device thus constructed is capable of achieving compact die size and meeting high endurance application requirement.

Figure 1:
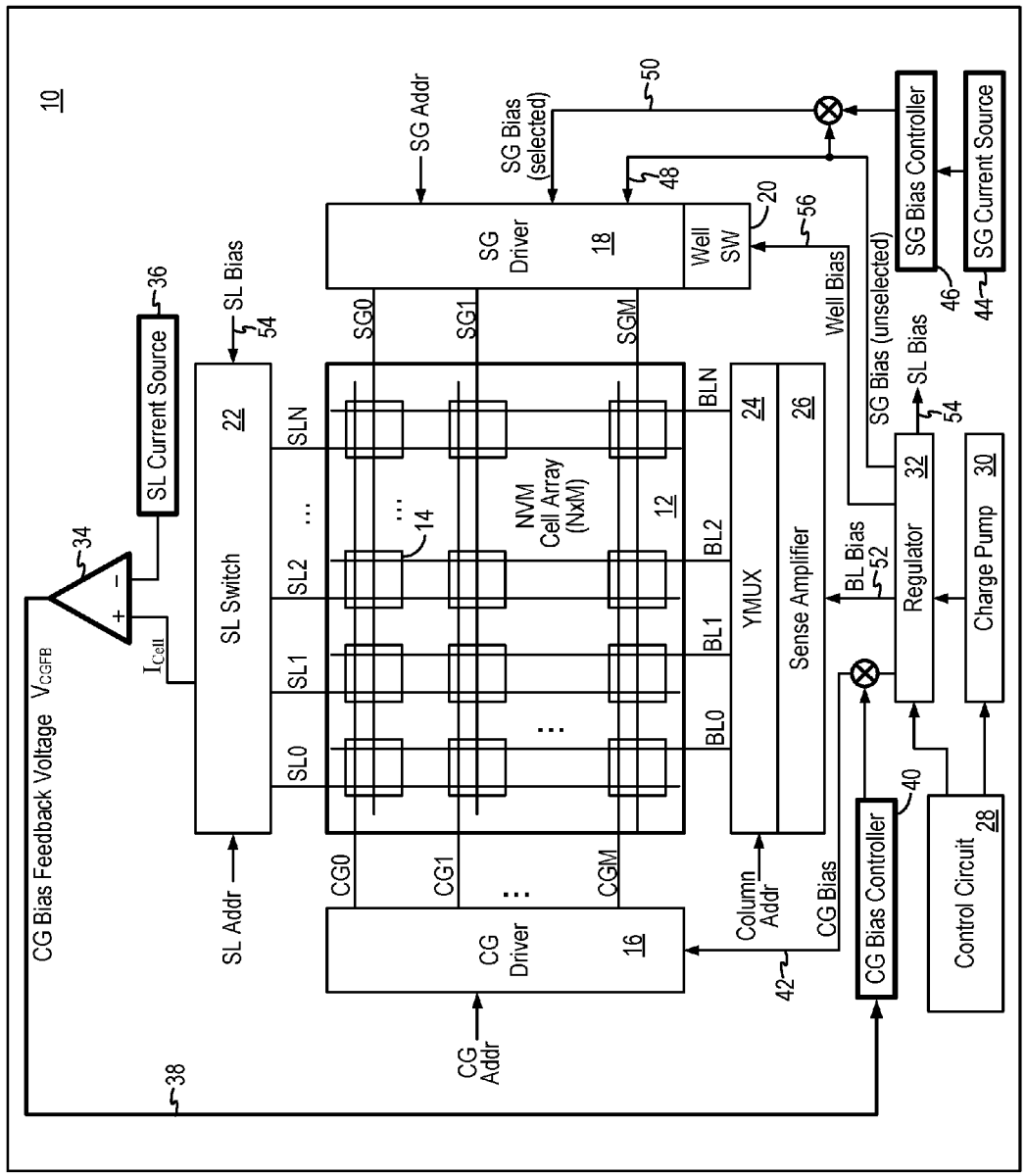
FIG. 1 is a block diagram of a non-volatile memory (NVM) device in one exemplary embodiment.

FIG. 1 is a block diagram of a non-volatile memory (NVM) device in one exemplary embodiment. FIG. 1 is illustrative only and the NVM device may include additional components not shown in FIG. 1. Referring to FIG. 1, the NVM device 10 includes a two-dimensional array 12 of non-volatile memory cells 14. In the present embodiment, NVM device 10 is implemented as a PMOS MTP flash memory device and non-volatile memory cells 14 are implemented as PMOS MTP flash memory cells using only a single polysilicon layer. In some embodiments, NVM device 10 may be an embedded component formed as part of another integrated circuit.

In embodiments of the present invention, the cell array 12 is addressed by a control gate address (CG Addr), a select gate address (SG Addr), a source line address (SL address) and a column address to selectively access the PMOS MTP flash memory cell 14 ("memory cell 14") for read, program (write) and erase operations. In particular, the control gate address is provided to a control gate (CG) driver 16 and the select gate address is provided to a select gate (SG) driver 18 to select a row of memory cells 14 in cell array 12. Meanwhile, the column address is provided to an YMUX circuit 24 to select the bit-lines of the cell array 12. The source line address is provided to a SL switch 22 to select the source lines of the cell array 12. Accordingly, the PMOS MTP flash memory cells 14 in the cell array 12 are accessed by control gate signals CG0 to CGM, select gate signals SG0 to SGM, bit-lines BL0 and BLN and source lines SL0 to SLN.

The CG driver 16 and the SG driver 18 selectively activate a row of the cell array 12 while the YMUX 24 and the SL Switch 22 selectively activate a column of the cell array 12 to allow a memory cell 14 at the intersection of the selected CG/SG and selected BL/SL to be accessed. To read data from or write data to the cell array 12, the YMUX circuit 24 (also referred to as the "bit-line selection circuit") connects the bit-lines to either a write driver circuit (not shown) or a sense amplifier circuit 26. In practice, the cell array 12 includes multiple banks of memory cells, one bank for each input/output (I/O) of the MTP flash memory device. For example, a MTP flash memory device may have a 16-bit I/O or a 32-bit I/O and thus the cell array 12 of the flash memory device may include 16 or 32 banks of memory cells. The block diagram of FIG. 1 illustrates a cell array with single bank of memory cells but it is understand, in actual implementations, the cell array may include multiple banks of memory cells for the I/Os of the memory device.

Figure 2:
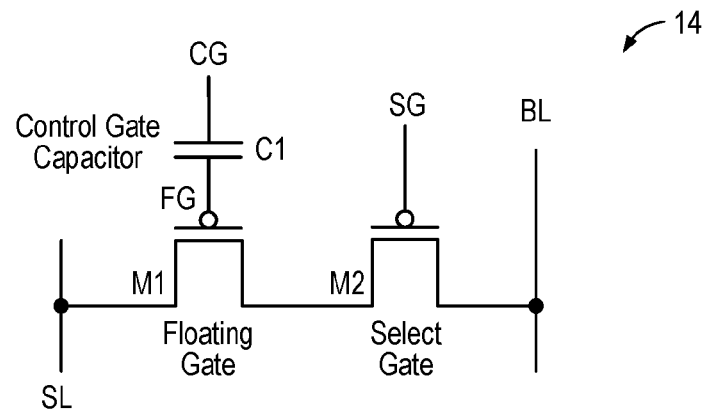
FIG. 2 is a circuit diagram of a PMOS MTP flash memory cell in some embodiments of the present invention.
Figure 3:
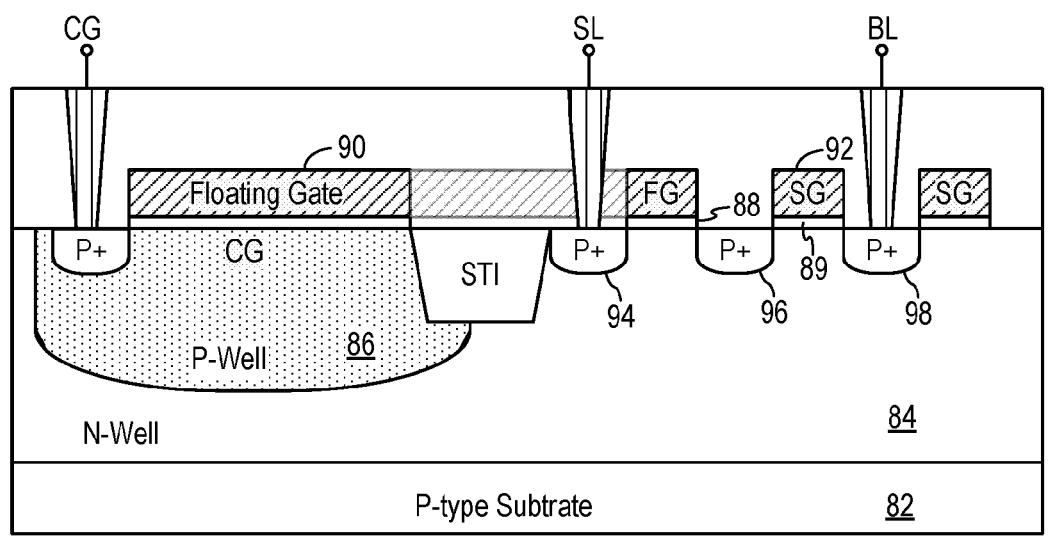
FIG. 3 is a cross-sectional view of a PMOS MTP flash memory cell in some embodiments of the present invention.

In the present embodiment, memory cells 14 are implemented as PMOS MTP flash memory cells, as shown in FIGS. 2 and 3. Referring to FIG. 2, a PMOS MTP flash memory cell 14 is configured as a two-transistor memory cell. The memory cell 14 includes a PMOS transistor M1 as the floating gate, a PMOS transistor M2 as a select gate, a capacitor C1 formed in a P-well as the control gate. The select gate and the floating gate are connected in series between the bit-line and the source line. The control gate is capacitively coupled to the floating gate transistor. Referring to FIG. 3, in one exemplary embodiment, a PMOS MTP flash memory cell 14 is formed on a lightly doped P-type substrate 82. The PMOS transistors are formed in an N-Well 84. The select gate PMOS transistor includes a drain region 98 connect to the bit-line BL, a source region 96 which also serves as the drain region of the floating gate transistor, and a gate electrode 92 formed insulated from the substrate by a thin gate oxide layer 89. The floating gate PMOS transistor includes a drain region 96 shared with the select gate transistor, a source region 94 connect to the source line SL, and a gate electrode 90 formed insulated from the substrate by a thin gate oxide layer 88. The floating gate polysilicon layer 90 is extended over a P-well 86 which forms the control gate electrode. The extended floating gate polysilicon layer is insulated from the P-well by the thin gate oxide layer 88. Accordingly, a capacitor is formed between the P-well 86 and the floating gate electrode 90. The floating gate electrode is therefore capacitively coupled to the control gate CG. The floating gate therefore follows the bias condition applied to the control gate CG.

Figure 4:
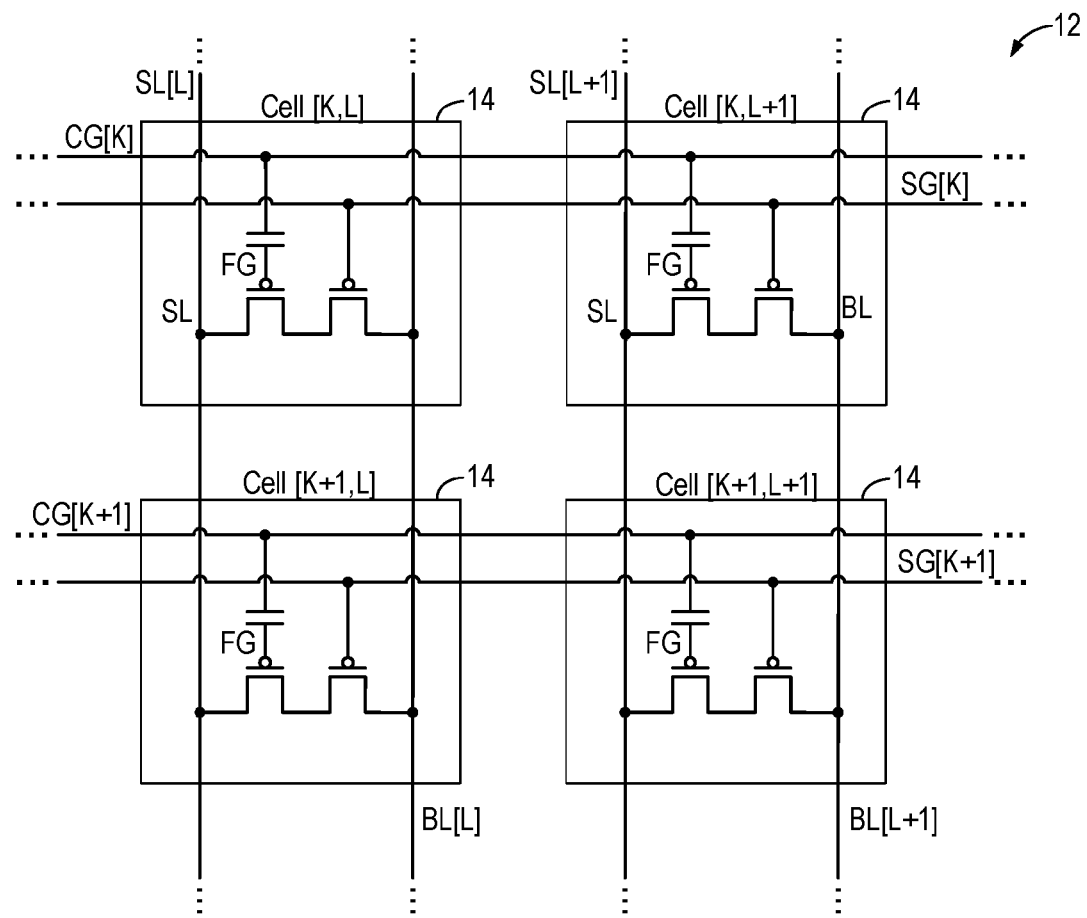
FIG. 4 illustrates a portion of a cell array in the PMOS MTP memory device in embodiments of the present invention.

FIG. 4 illustrates a portion of a cell array in the PMOS MTP memory device in embodiments of the present invention. In the PMOS MTP memory cell array 12, memory cells 14 on the same row—Cell [K, L] and Cell [K, L+1]—share the same control gate signal CG[K] and the same select gate signal SG[K]. Furthermore, memory cells 14 on the same column—Cell [K, L] and Cell [K+1, L]—share the same bit-line BL[L] and the same source line SL[L].

To access a flash memory cell in the cell array 12, an input address is provided to the flash memory device 10. The input address is decoded into the control gate address, the select address, the column address and the source line address. As a result of the address decoding, one row of memory cells associated with rows CG0 to CGM (and SG0 to SGM) is selected and one column of memory cells associated with BL0 to BLN (and SL0 to SLN) is selected. In this manner, the memory cell associated with the activated row and the activated column is made available for either read, write or erase operation. In practice, the flash memory device 10 activates the memory cells associated with all of the I/Os of the memory device, such as a byte of data. For example, the memory cells associated with one byte of data or eight I/Os, may be activated for access based on the input address. More specifically, the flash memory device activates one bit-line in each bank of memory cells associated with a single I/O, each bank being associated one set of write driver and sense amplifier circuit.

The operation of the PMOS MTP flash memory device 10 and the PMOS MTP flash memory cell 50 will be described with reference to FIGS. 1-4. In the present example, the PMOS MTP flash memory cell is adapted to store one bit of data. The PMOS MTP flash memory cell has a logical state of "1" when the cell is erased and a logical state of "0" when the cell is programmed. It is understood that flash memory cells or the memory cell array may be constructed to operate in the opposite logical states.

First, programming or writing data to the PMOS MTP flash memory cell is performed by transferring charge carriers from the N-well semiconductor layer 84 to the floating gate 90 by tunneling through the thin gate oxide layer 88. The bit-line is biased to the VPP voltage (e.g. 6V) while the source line is biased to Vss (e.g. 0V). The N-well 84 is also biased to the VPP voltage (e.g. 6V). Under the conventional program method, the select gate SG is biased to the VDD voltage (e.g. 2V) and the control gate voltage is stepped from a low voltage value to a high voltage value (e.g. 3V to 6V) over several voltage steps. As a result of the biasing condition, hot carriers or hot electrons are injected into the floating gate 90 from the source 94. As a result of the hot carrier injection, the floating gate is turned on during the programming operation of the memory cell. When the biasing voltages are removed, the charges are trapped on the floating gate 90 and the memory cell is programmed to a logical state of 0.

More specifically, as the programming progress, the threshold voltage $V_T$ of the floating gate transistor M1 decreases (becoming less negative or more positive). Note that a PMOS transistor is turned on by the application of a negative gate-to-source voltage $V_{GS}$ greater than the threshold voltage $V_T$ of the transistor. Therefore, a PMOS transistor with decreased or positive $V_T$ will be turned on easily with a small $V_{GS}$ voltage or at 0V $V_{GS}$. Meanwhile, a PMOS transistor with increased or negative $V_T$ will require a higher or more negative $V_{GS}$ voltage to be turned on. During the programming of the PMOS MTP memory cell, hot carriers are injected into the floating gate to reduce the threshold voltage of the PMOS transistor and the floating gate transistor M1 becomes turned on during the programming operation and the drain current increases.

Second, erasing the PMOS MTP flash memory cell is performed by transferring charge carriers from the floating gate to the N-well 84. To erase a memory cell, the control gate is grounded while the select gate, the source line and the N-well are all biased to an elevated positive voltage (e.g. greater than 7V). As the charge carriers are pull off the floating gate, the threshold voltage of the PMOS transistor M1 is increased and the floating gate transistor M1 becomes turned off during the erase operation. An erased PMOS MTP flash memory cell has a threshold voltage $V_T$ that is higher or more negative than a programmed PMOS MTP flash memory cell. When the floating gate 90 is left with no charge carriers, the memory cell has a logical state of 1.

Finally, a PMOS MTP flash memory cell is read by applying a gate voltage that is an intermediate threshold voltage of an erased memory cell (logical "1") and a programmed memory cell (logical "0"). When a flash memory cell is erased, the PMOS memory cell transistor is turned on by the application of a first threshold voltage. When the flash memory cell is programmed, the memory cell transistor requires a second threshold voltage lower (or more positive) than the first threshold voltage to turn on. To read a flash memory cell, a gate-to-source voltage between the first and second threshold voltages are applied to the control gate. In one example, the select gate is biased to 0V to turn on the select gate transistor. The control gate is biased to 0V and the source line is biased to the VDD voltage of 2V, resulting in a gate-to-source voltage of −2V at the floating gate. When the memory cell is programmed, the floating gate is turned on by the application of the gate-to-source voltage. A cell current flows through the memory cell and a logical state of "0" is measured at the BL. When the memory cell is erased, the floating gate remains turned off by the application of the gate-to-source voltage. No cell current is measured through the memory cell and a logical state of "1" is measured at the BL.

In the following description, the operation of the PMOS MTP flash memory device is described with reference to a single memory bank for a single I/O, the memory bank being associated with a single write driver circuit and a single sense amplifier circuit. As described herein, references to the "flash memory cell array" may refer to the bank of memory cell array associated with a single I/O. The structures and methods described herein applies to all of the I/Os in the flash memory device and the structures and methods are described with reference to a single I/O for simplicity purpose. It is understood that the flash memory device includes multiple banks of memory cells, one memory cell bank for each I/O and further includes a bank of write drivers and a bank of sense amplifiers, a set of write driver and sense amplifier being associated with a single I/O.

Although PMOS MTP flash memory devices have come into wider use, programming of PMOS MTP flash memory cells remains a challenge. A particular problem in programming of PMOS MTP flash memory cells is associated with memory cells that are over-erased. When a PMOS MTP flash memory cell is over-erased, the memory cell has a very high (or very negative) threshold voltage. With the high threshold voltage, the floating gate transistor may not be able to turn on during the programming operation. When the floating gate transistor cannot be turned on, the memory cell cannot be programmed. FIG. 5 illustrates the memory cell bias condition of a conventional program operation in some examples. In particular, FIG. 5 illustrates the cell bias condition for a block of four memory cells with the upper left memory cell being the one selected to be programmed. The upper right memory cell is associated with an un-selected bit-line. The bottom left memory cell is associated with an un-selected select gate. The bottom right is associated with an un-selected bit-line and un-selected select gate.

In the conventional program operation, the select gate of the selected memory cell is biased to the VDD voltage (e.g. 2V) while the bit-line is biased to the VPP voltage (e.g. 6V). The select gate transistor is thus turned on. At the floating gate transistor, the source line is biased to 0V while the control gate is stepped from 3V to 6V, in a 1-voltage interval. The conventional program method uses a very high (or more negative) control gate voltage, which translates to a high floating gate voltage, to ensure that the channel is fully turned on to enable programming to take place. However, the high control gate voltage bias condition corresponds to a high drain current and a very low gate current, resulting in a programming operation that consumes large power but with slow programming speed.

Figure 7:
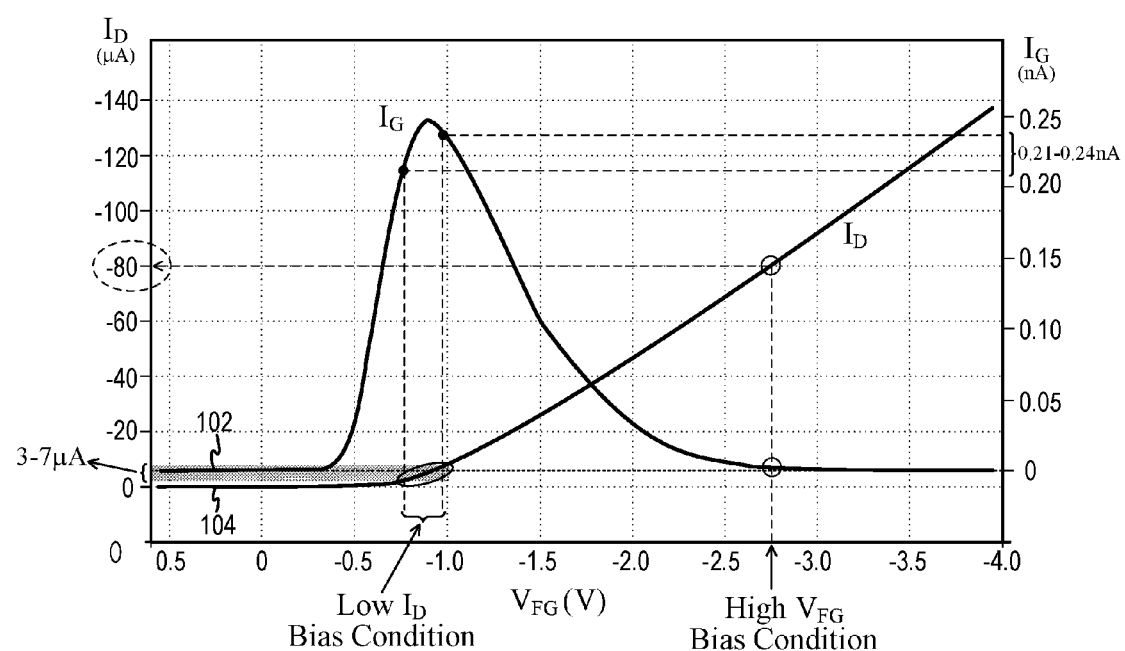
FIG. 7 is a plot of the drain current and the gate current versus the floating gate voltage $V_{FG}$ of a PMOS MTP memory cell in some examples.

FIG. 7 is a plot of the drain current and the gate current versus the floating gate voltage $V_{FG}$ of a PMOS MTP memory cell in some examples. Note that the floating gate is capacitively coupled to the control gate and therefore the floating gate voltage follows the control gate bias voltage. Referring to FIG. 7, the gate current $I_G$ at the floating gate transistor of the PMOS MTP memory cell is illustrated by curve 102 while the drain current $I_D$ at the floating gate transistor is illustrated by the curve 104. The drain current $I_D$ is also the cell current of the memory cell. The gate current $I_G$ peaks at a floating gate voltage bias voltage of –0.9V and decreases to lower gate current values for more negative $V_{FG}$ bias voltages. Meanwhile, the drain current $I_D$ increases as the floating gate bias increases to more and more negative voltage values.

In the conventional programming method, a high control gate bias is used resulting in a high floating gate bias. The high floating gate bias condition is such that the memory cell is operated at a point where the drain current $I_D$ is very high, e.g. 80 μA, while the gate current $I_G$ is very low (e.g. near 0). The conventional programming method has several shortcomings.

First, due to the large drain current being drawn during programming, the conventional programming method often cannot meet low power consumption requirement. Thus, in some cases, in order to limit power consumption, the conventional programming method is implemented to program only one bit at a time. For instance, when programming one bit draws a drain current of 80 μA, programming one byte will draw 640 μA of drain current. The high drain current drawn for byte programming will require the memory device to have a large charge pump which in most cases is not practical. When low power consumption is demanded, the conventional programming method can only be used to program 1 bit at a time, resulting in very slow programming speed.

Second, in PMOS MTP flash memory devices, over-erased memory cells become very difficult to program. In the course of the programming operation, the control gate bias is applied so that the threshold voltage of the floating gate transistor is shifted to less negative or more positive voltages. For normally erased cell, the threshold voltage shifts are sufficient to turn on the floating gate transistor for programming. However, for over-erased floating gate transistor with very negative threshold voltages, even with increased control gate bias voltage, the threshold voltages of these over-erased floating gate transistors cannot be shifted sufficiently to allow the floating gate transistors to be turned on. Accordingly, these over-erased memory cells cannot be programmed.

In embodiments of the present invention, a programming method for a PMOS MTP flash memory device biases the select gate transistor to a constant select gate drain current level and sweeps the control gate bias voltage from a low voltage level to a high voltage level while maintaining the cell current around a predetermined cell current limit level. The programming method of the present invention is able to realize low power programming with high efficiency. The programming method can be used to perform multi-bit programming for PMOS MTP flash memory devices to increase programming speed. Furthermore, the programming method is able to reliably program over-erased memory cells.

The programming method of the present invention implements searching of the optimal control gate bias voltage through cell current feedback. Meanwhile, the cell current is controlled by a current source to remain within a desired value. In this manner, the programming efficiency is maximized by performing the programming around an operating point with maximum gate current. The program time is reduced and the program cell current is minimized. With the lower cell current drawn during programming, a smaller size charge pump can be used. Furthermore, with the cell current well controlled, multiple bits can be programmed at the same time. The maximum program cell current is limited to within the charge pump sustain capability. As a result, the programmed memory cells of the PMOS MTP flash memory device have narrow $V_T$ distribution.

The programming method of the present invention will be described with reference to FIGS. 1, 6, 7 and 8. FIG. 6 illustrates the memory cell bias condition used in the programming method for a PMOS MTP flash memory device in embodiments of the present invention. In particular, FIG. 6 illustrates the cell bias condition for a block of four memory cells with the upper left memory cell being the one selected to be programmed. The upper right memory cell is associated with an un-selected bit-line. The bottom left memory cell is associated with an un-selected select gate. The bottom right is associated with an un-selected bit-line and un-selected select gate. Referring to FIG. 6, in the programming method of the present invention, a select gate voltage $V_{SG}$ is used to bias the select gate transistor to cause a fixed drain current to flow through the select gate. In the present embodiment, the select gate drain current is set to 7 μA. Meanwhile, a control gate bias voltage $V_{CG}$ is applied to the control gate terminal where the control gate bias voltage is varied from a first voltage to a second, higher voltage to search for the optimal control voltage for a given cell current limit. In the present embodiment, the control gate bias voltage $V_{CG}$ is varied from 0V to 6V while the cell current is limited to 3 μA. In the embodiment shown in FIG. 6, the VPP voltage is 6V while the VDD voltage is 2V.

Figure 8:
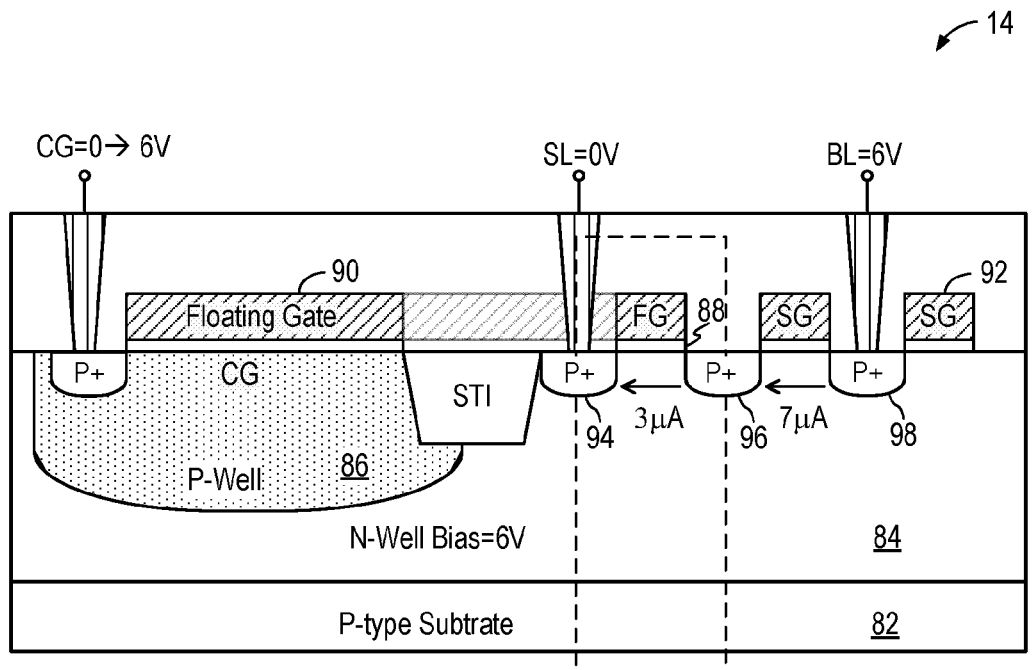
FIG. 8, which includes
Figure 8A:
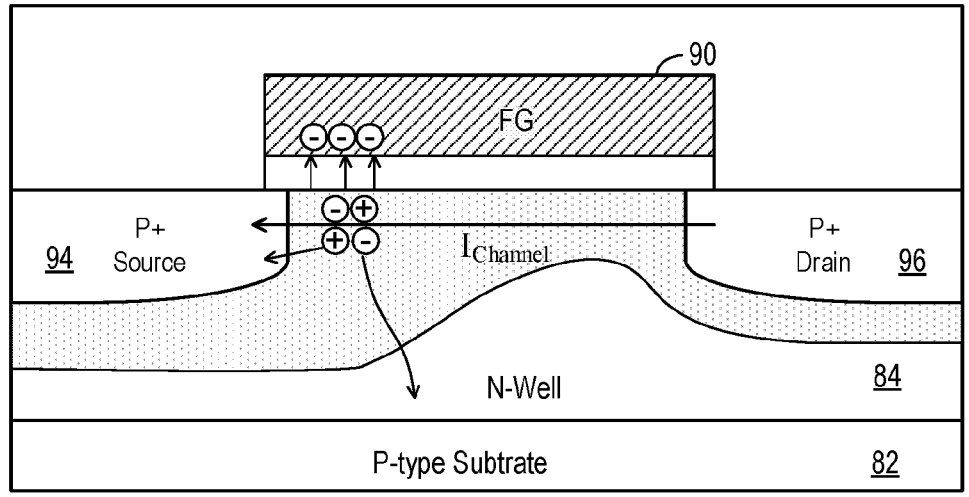
FIG. 8A, is a cross-sectional view of a PMOS MTP flash memory cell illustrating the application of the programming method of the present invention in some embodiments.

FIG. 8, which includes FIG. 8A, is a cross-sectional view of a PMOS MTP flash memory cell illustrating the application of the programming method of the present invention in some embodiments. Referring to FIG. 8, in the memory cell 14 during programming, the bit-line is driven to 6V, the N-well is also biased to 6V, and the source line is biased to 0V. Meanwhile the select gate SG is biased so that a drain current of 7 μA flows through the select gate transistor. Meanwhile, the control gate bias voltage applied to the control gate terminal scans a voltage range of 0V to 6V while maintaining a 3 μA drain current at the floating gate transistor. With the memory cell thus biased, hot carrier injection occurs at the source region 94 of the floating gate transistor to inject negatively charged carriers into the floating gate, thereby decreasing the threshold voltage of the floating gate transistor, as shown in FIG. 8A. In this manner, the PMOS MTP flash memory cell 14 is biased at an optimal operating point for low power programming at high efficiency. In the two-transistor PMOS MTP flash memory cell, the threshold voltage $V_T$ for the PMOS select gate transistor is fixed or do not change while the threshold voltage $V_T$ for the PMOS floating gate transistor is changed between the erase state (more negative $V_T$) and the program state (more positive $V_T$).

Returning to FIG. 7, under the programming method of the present invention, the floating gate voltage $V_{FG}$ is set at a region where the drain current is between 3-7 µA, denoted as the low drain current $I_D$ bias condition. At the low drain current $I_D$ bias condition, the cell current is small as the drain current of the floating gate transistor is limited. Meanwhile, the low drain current $I_D$ bias condition corresponds to a high gate current operating point. In operation, the gate current $I_G$ maximum is the most efficient operating point for programming as the floating gate drain current is low when the gate current is at its maximum. Accordingly, the programming method of the present invention can realize low power programming with fast program speed.

Returning to FIG. 1, in PMOS MTP flash memory device 10, a charge pump 30 and a regulator 32, controlled by a control circuit 28, generate the bias currents for the cell array 12. The charge pump 30 and regulator 32 generates the bit-line bias 52 provided to the bit-lines BL0 to BLN, the well bias 56 provided to the Well switch 20, the select gate bias for unselected cells 48 and selected cell 50 provided to the select gate driver 18, the control gate bias 42 provided to the control gate driver 16, and the source line bias 54 provided to the source line switch 22. To implement the programming method of the present invention, a select gate current source 44 generates a select gate drain current level for the program operation. A select gate bias controller 46 receives the select gate drain current level and generates the select gate bias voltage for the selected memory cell 50 for programming of the selected memory cell. In particular, the select gate bias controller 46 modulates the select gate bias generated for the unselected memory cell 48 to generate the select gate bias voltage for the selected memory cell 50.

Furthermore, to implement the programming method of the present invention, a source line current source 36 generates a current indicative of the predetermined cell current limit. A sense amplifier 34 compares the cell current of the selected cell for programming with the predetermined cell current limit and generates a control gate bias feedback voltage signal $V_{CGFB}$ (node 38). A control gate bias controller 40 receives the control gate bias feedback voltage signal $V_{CGFB}$ and generates the control gate bias 42 which is coupled to the control gate driver 16 to be provided to the selected control gate. In particular, the control gate bias controller 40 modulates the control gate bias generated by the regulator 32 to generate the control gate bias voltage for the selected control gate.

FIG. 9 illustrates the memory cell bias conditions that can be used to erase and to read the PMOS MTP flash memory cells in embodiments of the present invention. In particular, FIG. 9 illustrates the cell bias condition for a block of four memory cells with the upper left memory cell being the one selected to be erased or read. The upper right memory cell is associated with an un-selected bit-line. The bottom left memory cell is associated with an un-selected select gate. The bottom right is associated with an un-selected bit-line and un-selected select gate. FIG. 9 provides example bias conditions. One of ordinary skill in the art would appreciate that other biasing conditions may be used to erase and read the PMOS MTP flash memory cells.

Figure 10:
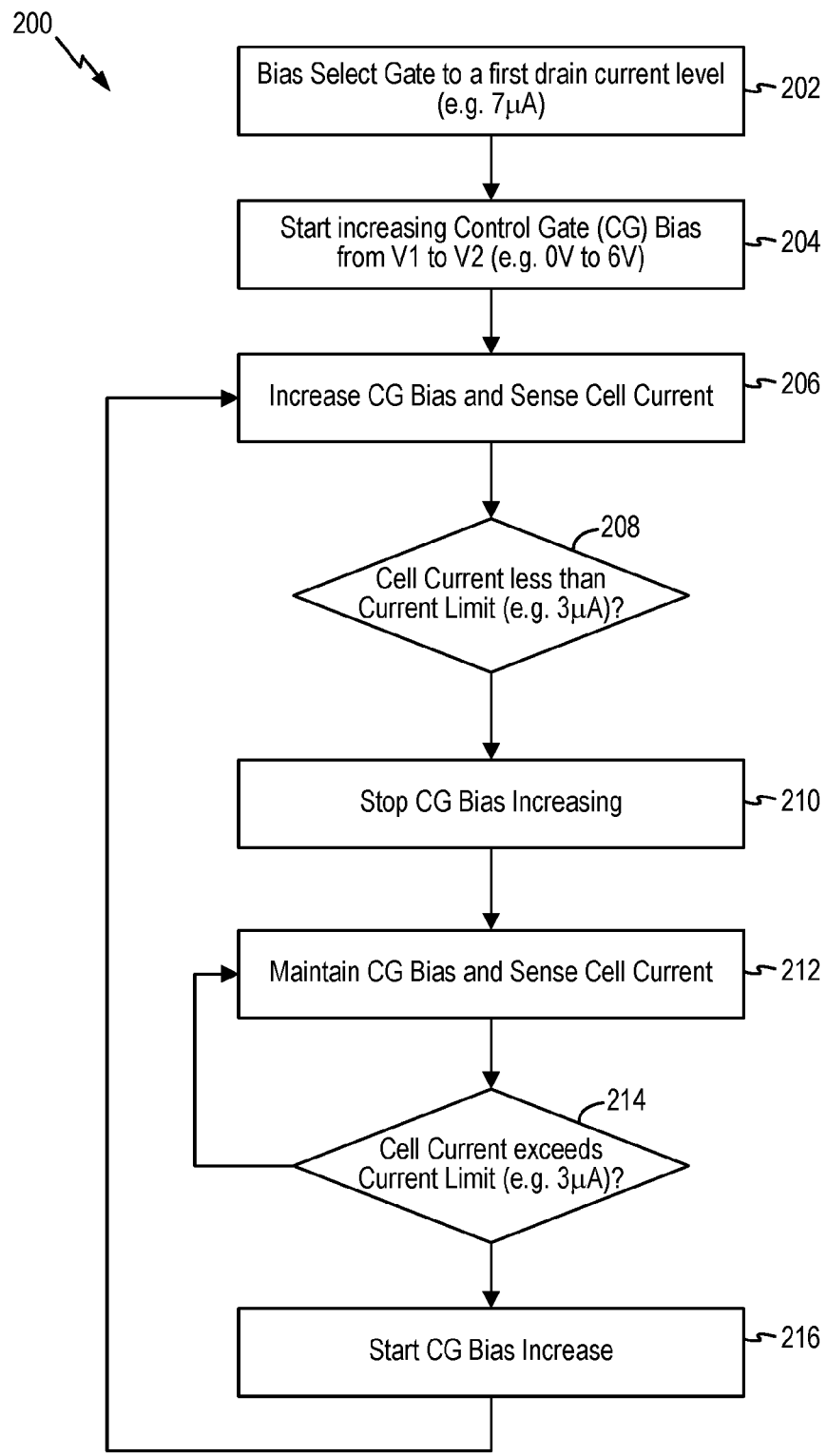
FIG. 10 is a flowchart illustrating a programming method for a PMOS MTP flash memory device in embodiments of the present invention.
Figure 11A:
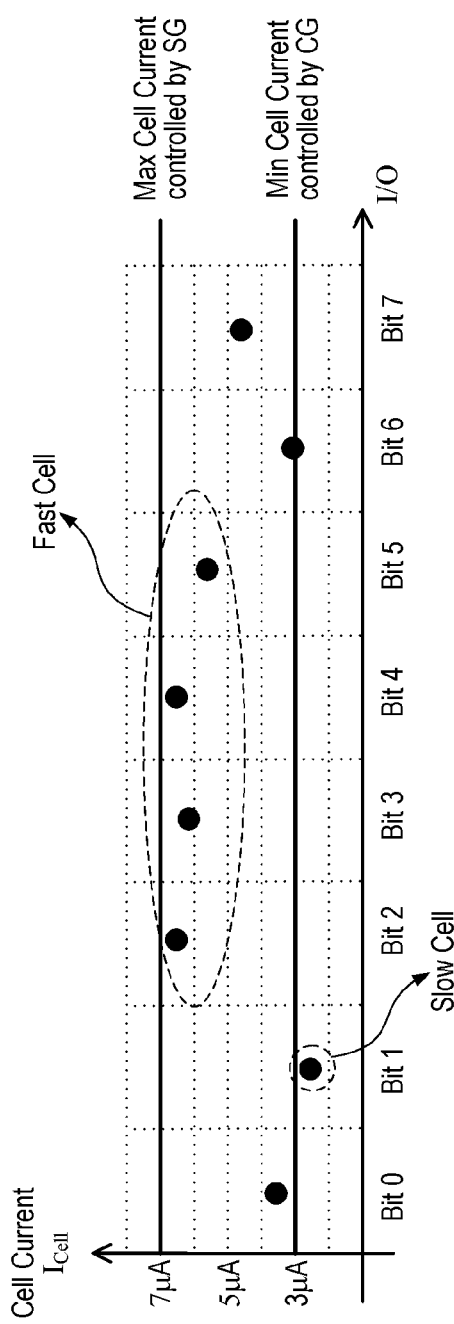
FIGS. 11(A) and 11(B), illustrates the programming operation using the programming method of FIG. 10 in some embodiments.
Figure 11B:
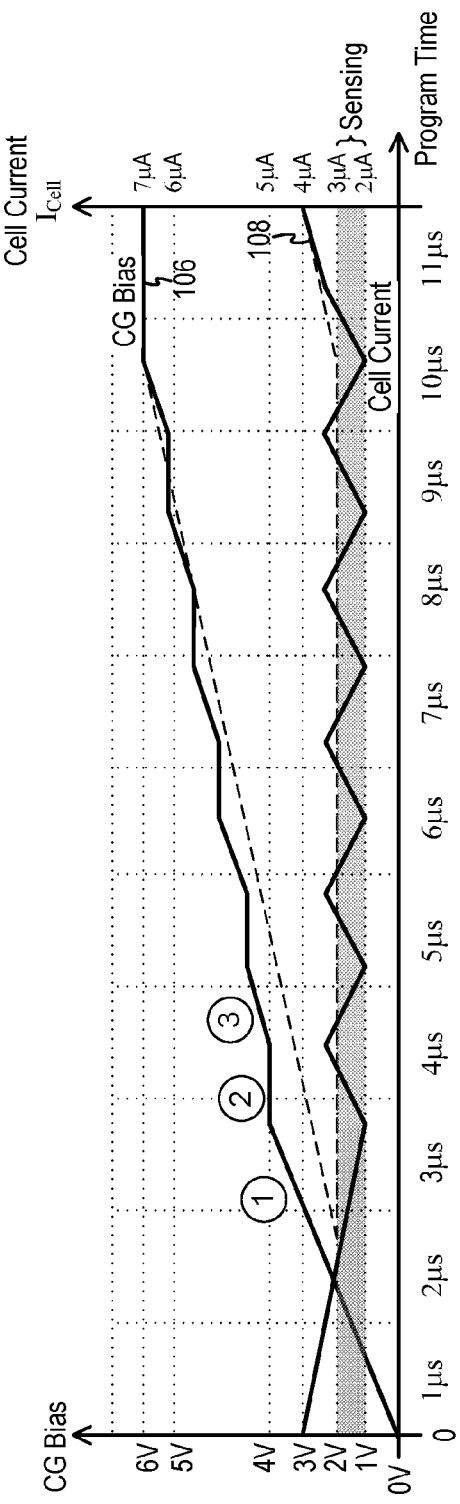

FIG. 10 is a flowchart illustrating a programming method for a PMOS MTP flash memory device in embodiments of the present invention. In some embodiments, the programming method of the present invention can be applied to the PMOS MTP flash memory device of FIG. 1 and the 2-transistor PMOS MTP flash memory cell of FIGS. 2 and 3. The programming method of FIG. 10 will be explained with reference to FIG. 11. FIG. 11, which includes FIGS. 11(A) and 11(B), illustrates the programming operation using the programming method of FIG. 10 in some embodiments. In particular, FIG. 11(A) illustrates the characteristics of PMOS MTP flash memory cells as having a distribution of cell current values. For example, in a byte of memory cells, some of the memory cells may have large cell currents and are considered "fast cells." Fast cells can be turned on easily during programming and therefore they can be programmed easily. On the other hand, other memory cells may have small cell currents and are considered "slow cells." Slow cells with low cell current needs to be turned on slowly and therefore they are slow to program. FIG. 11(B) illustrates the control gate bias (CG Bias) voltage 106 and the cell current 108 of a memory cell selected for programming through the programming process in some examples.

Referring to FIG. 10, a programming method 200 for a PMOS MTP flash memory device is applied to program a PMOS MTP flash memory cell selected for programming ("the selected memory cell"). At 202, the programming method 200 biases the select gate transistor of the selected memory cell to a first drain current level. In other words, a select gate bias voltage is applied to the gate terminal of the select gate transistor to cause a drain current having the first drain current level to flow in the select gate transistor. In one example, the first drain current level is 7 µA. With the select gate transistor thus biased, the programming method 200 starts to increase the control gate bias voltage of the selected memory cell from a first voltage value V1 to a second, higher voltage value V2 (204). For example, in some embodiments, the programming method 200 sweeps the control gate bias voltage from 0V to 6V.

The programming method 200 increases the control gate bias voltage while sensing the cell current from the selected memory cell (206). The programming method 200 monitors the cell current to find the optimal control gate bias voltage for programming the selected memory cell. In embodiments of the present invention, the cell current of the selected memory cell is the drain current flowing in the floating gate transistor and is measured at the source line of the selected memory cell. Referring to FIG. 11(B), in region 1, with the control gate bias increasing, the floating gate voltage is maintained at a given level and the drain current of the floating gate transistor decreases. The programming method 200 determines when the cell current has decreased to less than the cell current limit (208). In one example, the cell current limit is 3 µA.

When the cell current has decreased to the cell current limit or below (208), the programming method 200 stops the control base bias increase (210). The programming method 200 maintains the control gate bias while sensing the cell current (212). Referring to FIG. 11(B), in region 2, with the cell current falling below the cell current limit (3 µA), the control gate bias voltage is held constant. With the control gate bias voltage being held constant, the floating gate voltage will decrease and the drain current increases. As the programming of the selected memory cell progresses, the drain current of the floating gate transistor continues to increase. The programming method 200 monitors the cell current and determines when the cell current has increased to exceed the cell current limit (e.g. 3 µA) (214). When the cell current has increased to the cell current limit or exceeding the cell current limit (214), the programming method 200 starts to increase the control gate bias voltage (216). The method 200 repeats at 206 where the control gate bias is increased while the cell current is monitored.

Referring to FIG. 11(B), in region 3, with the cell current increasing above the cell current limit (3 µA), the control gate bias starts to increase from the previously held voltage level. With the control gate bias increasing, the floating gate bias remains at a given level and the drain current of the floating gate transistor decreases. The programming method 200 monitors the cell current and stops the control gate bias increase in response to the cell current having decreased to the cell current limit (208) and starts the control gate bias increase in response to the cell current having increased to the cell current limit (214). The programming of the selected memory cell continues until the maximum cell bias voltage V2 (e.g. 6V) is reached and the selected memory cell is thus programmed.

In FIG. 11(B), the dotted line along the CG bias voltage curve 106 and the dotted line along the cell current curve 108 indicates the ideal behavior of the CG bias voltage and the cell current. In the ideal situation, the cell current will be maintained constantly at the cell current limit (e.g. 3 µA) while the control gate bias voltage increases linearly. However, in actual implementation, the control gate bias voltage is increased in a piece-wise linear fashion and the cell current assumes a triangle waveform. This is because in actual implementation, there is a delay in the current detection. That is, as the cell current decreases to the cell current limit, the delay in current detection means that the cell current will decrease to below the cell current limit (less than 3 µA) before the programming method is triggered to stop the control gate bias increase. Similarly, as the cell current increases to the cell current limit, the delay in current detection means that the cell current will increase beyond the cell current limit (greater than 3 µA) before the programming method is triggered to start the control gate bias increase. As a result, the cell current assumes a triangle waveform and the control gate bias is increased in a piece-wise linear fashion. That is, the control gate bias is increased linearly with intervening steps where the control gate bias is held constant.

With the use of the programming method of the present invention, the programming of the selected memory cell is performed with the cell current circulating between the minimum of the cell current limit (e.g. 3 µA) and the maximum of the select gate drain current level (e.g. 7 µA). Thus, the cell current is well controlled to within a narrow current range of low current values during programming. Accordingly, the programming method of the present invention realizes low power programming which enables multi-bit or byte-wise programming of the PMOS MTP flash memory device. For example, even when all the memory cells within a byte have high cell current, the maximum cell current is limited to the select gate drain current level (e.g. 7 µA). So even when each memory cell of the byte draws the maximum cell current of 7 µA, the total current drawn during programming is only 56 µA. Accordingly, the programming method of the present invention enables the PMOS MTP flash memory device to perform programming with small program cell current to realize low power consumption and also to increase program speed by allowing byte-wise programming. Furthermore, the charge pump required to provide the program bias can be made small to reduce silicon real estate required to implement the PMOS MTP flash memory device.

FIG. 12, which includes FIGS. 12(a) and 12(b), illustrates the bias voltages and the threshold voltage shifts of PMOS MTP flash memory cells using the conventional programming method. Meanwhile, FIG. 13, which includes FIGS. 13(a) and 13(b), illustrates the bias voltages and the threshold voltage shifts of PMOS MTP flash memory cells using the programming method in embodiments of the present invention. Referring first to FIG. 12, the biasing condition for the conventional programming method is shown in FIG. 12A. In the conventional programming method, the selected select gate bias is set to the VDD voltage (e.g. 2V). The control gate is biased in voltage steps from 3V to 6V. FIG. 12B illustrates the distribution of memory cells over threshold voltages. In a PMOS MTP flash cell array, erased memory cells have a threshold voltage $V_T$ around 0V. With each application of the stepped increase control gate bias, the threshold voltages of the erased memory cells are shifted to more positive voltages. However, when there is an over-erased cell, the conventional programming method is not able to turn on the over-erased cell as the threshold voltage of the over-erased cell is not high enough for the control gate bias voltage to turn on the over-erased cell. The programming of the over-erased cell will therefore fail as the PMOS MTP flash memory needs to be able to be turned on to be programmed.

Referring to FIG. 13, the biasing condition for the programming method of the present invention is shown in FIG. 13A. The selected select gate is based at a voltage level to provide the desired select gate drain current (e.g. 7 µA). The control gate voltage is swept from a first voltage (e.g. 0V) to a second voltage (e.g. 6V) while the cell current is maintained around the cell current limit (e.g. 3 µA). FIG. 13B illustrates the distribution of memory cells over threshold voltages. In a PMOS MTP flash cell array, erased memory cells have a threshold voltage $V_T$ around 0V. The programming method of the present invention searches for the optimal control gate bias between 0V and 6V. Therefore, even when there is an over-erased memory cell, the memory cell is able to be turned on and programmed. The programming method of the present invention is therefore capable of reliably programming over-erased memory cells.

Figure 14:
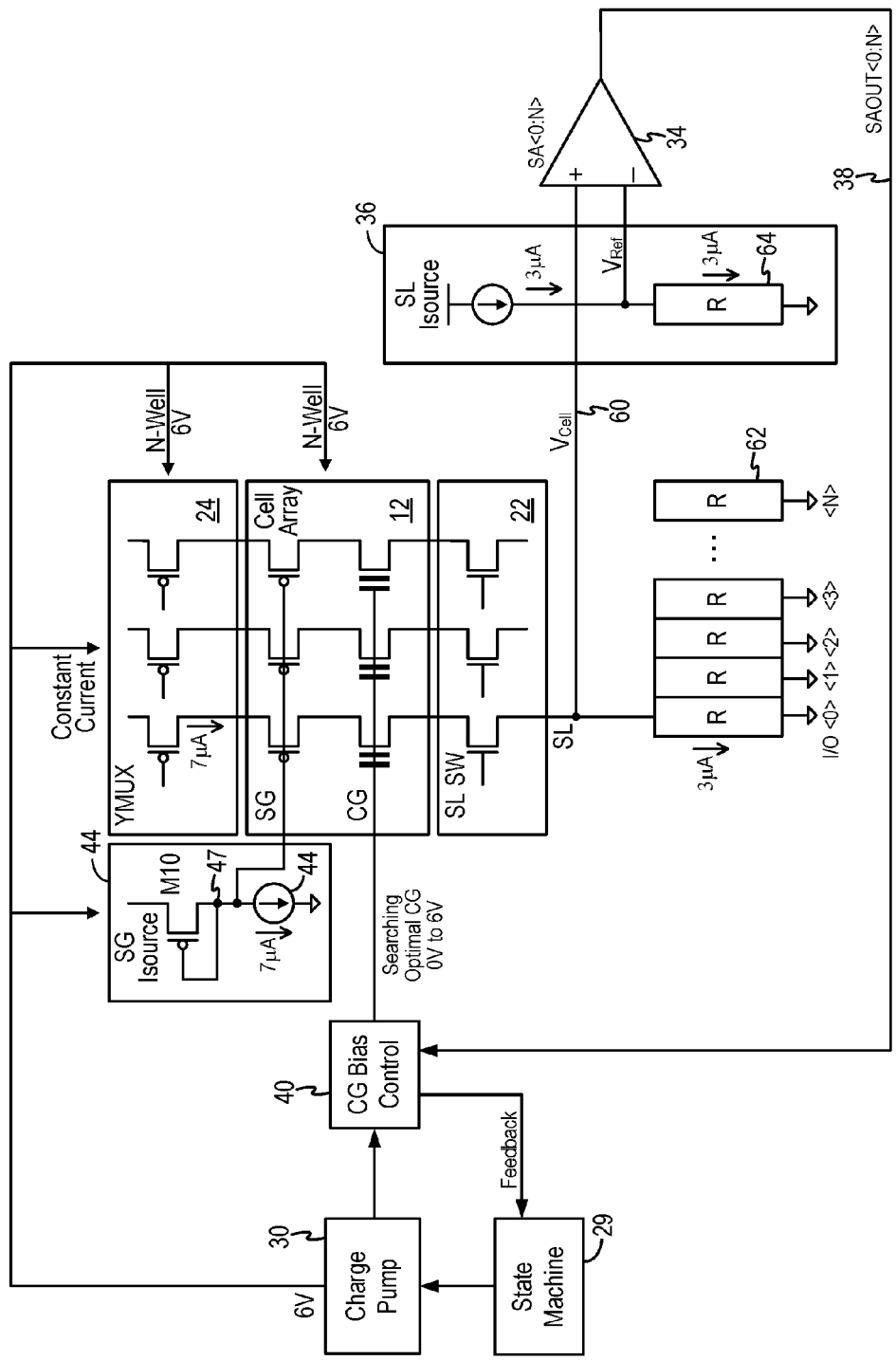
FIG. 14 is a schematic diagram of a PMOS MTP flash memory device illustrating the circuitry used to implement the programming method in embodiments of the present invention.

FIG. 14 is a schematic diagram of a PMOS MTP flash memory device illustrating the circuitry used to implement the programming method in embodiments of the present invention. Referring to FIG. 14, the select gate bias controller 46 includes the current source 44 generating the desired select gate drain current (7 µA). The select gate bias controller 46 includes a diode-connected PMOS transistor M10 which forms a current mirror with the selected select gate transistor. Accordingly, the gate voltage of the select gate transistor is biased to a voltage value (node 47) that results in the desired select gate drain current (7 µA) to flow through the select gate transistor. The control gate bias controller 40 generates the control gate bias voltage which sweeps from a first voltage to a second voltage to search for the optimal control gate bias. The memory device may include a state machine 29 which receives feedback signals from the control gate bias controller 40. The state machine 29 controls the charge pump 30 to generate the bias currents and voltages for the memory device. In some embodiments, the memory device may include a voltage regulator, such as the regulator 32 in FIG. 1, to generate the desired bias voltages.

To perform the sensing and monitoring of the cell current, the source line from each memory cell is coupled to a source line switch 22 which switchably connects the source line of the selected memory cell being programmed to the source line output node 60. The cell current at the source line output node 60 flows through an impedance element 62, such as a resistor, to develop a voltage $V_{Cell}$ indicative of the program cell current at the selected memory cell. The voltage $V_{Cell}$ is coupled to the positive input terminal of a sense amplifier 34. A source line current source 36 generates a current representing the cell current limit (3 µA) where the current flows into an impedance element 64 to generate a reference voltage $V_{Ref}$ indicative of the cell current limit. The voltage $V_{Ref}$ is coupled to the negative input terminal of the sense amplifier 34. The sense amplifier 34 generates a sense amplifier output signal SAOUT (node 38) which is coupled back to the control gate bias controller 40 to control the control gate bias voltage being generated. In this manner, the control gate bias is generated based on the cell current to ensure low power programming with high efficiency.

FIG. 14 illustrates the configuration of the PMOS MTP flash memory device for a single I/O. The programming method of the present invention can be applied to program a byte of databits in parallel. In that case, the source line output node from each bank of the memory cell array associated with the different I/Os is coupled to its individual impedance element. A bank of sense amplifier 34 (SA<0:N>) is provided to compare the voltage Wen from each I/O to the reference voltage $V_{Ref}$. The bank of sense amplifier output SAOUT<0:N> is then provided to the control gate bias controller 40 to generate the appropriate control gate bias voltages for each bank of I/Os.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for programming a PMOS multi-time programmable (MTP) flash memory cell, the memory cell comprising a select gate transistor connected in series with a floating gate transistor and a control gate capacitively coupled to the gate electrode of the floating gate transistor, the method comprising:
   applying a select gate bias voltage to a control terminal of the select gate transistor to generate a select gate drain current having a first current value;
   detecting a cell current flowing through the memory cell while applying to the control gate an increasing control gate bias voltage from a first voltage to a second, greater voltage;
   in response to detecting the cell current being less than a cell current limit, maintaining the control gate bias voltage at a constant voltage value while continuing to detect the cell current flowing through the memory cell; and
   in response to detecting the cell current being greater than the cell current limit, repeating the detecting the cell current while applying to the control gate the increasing control gate bias voltage, the control gate bias voltage being increased from a previous constant voltage value towards the second voltage until the control gate bias voltage reaches the second voltage.

2. The method of claim 1, further comprising:
   performing programming of the PMOS MTP flash memory cell by a program cell current being the cell current flowing through the memory cell, the program cell current having a maximum value determined by the first current value of the select gate drain current and a minimum value determined by the cell current limit.

3. The method of claim 1, wherein the first current value of the select gate drain current comprises 7 µA and the cell current limit comprises 3 µA.

4. The method of claim 1, further comprising:
   biasing a bit-line connected to a drain region of the select gate transistor to a first positive power supply voltage;
   biasing a source line connected to a source region of the floating gate transistor to a ground voltage; and
   biasing an N-well in which the select gate transistor and the floating gate transistor are formed to the first positive power supply voltage.

5. The method of claim 4, wherein applying to the control gate the increasing control gate bias voltage from the first voltage to the second, greater voltage comprises:
   applying to the control gate the increasing control gate bias voltage from the first voltage of 0V to the second, greater voltage of 6V, wherein the first positive power supply voltage comprises 6V.

6. The method of claim 1, wherein applying to the control gate the increasing control gate bias voltage from the first voltage to the second, greater voltage comprises:
   applying to the control gate the increasing control gate bias voltage from the first voltage to the second, greater voltage in a piece-wise linear fashion.

7. The method of claim 1, further comprising:
   programming the memory cell using hot carrier injection with the floating gate transistor being turned on during programming.

8. A non-volatile memory device, comprising:
   a two-dimensional array of PMOS multi-time programmable (MTP) flash memory cells, each memory cell being adapted to store one bit of data, each memory cell being accessed by a control gate signal, a select gate signal, a bit-line and a source line, each memory cell comprising a select gate transistor connected in series with a floating gate transistor and a control gate capacitively coupled to the gate electrode of the floating gate transistor;
   a select gate current source configured to generate a first current having a first current value;
   a select gate bias controller configured to generate a select gate bias voltage to be applied to the select gate transistor of a memory cell to be programmed to generate a select gate drain current having the first current value;
   a source line current source configured to generate a second current being a cell current limit;
   a sense amplifier configured to compare a first signal indicative of a program cell current of a memory cell being programmed and a second signal indicative of the cell current limit and to generate an output signal; and
   a control gate bias controller configured to generate a control gate bias voltage to be applied to the control gate of the memory cell to be programmed in response to the output signal of the sense amplifier, the control gate bias controller generate the control gate bias voltage having an increasing voltage value from a first voltage to a second, greater voltage,
   wherein in response to detecting the output signal of the sense amplifier indicating the program cell current is less than the cell current limit, the control gate bias controller maintains the control gate bias voltage at a constant voltage value while continuing to detect the output signal of the sense amplifier; and
   wherein in response to detecting the output signal of the sense amplifier indicating the program cell current is greater than the cell current limit, the control gate bias controller increases the control gate bias voltage from a previous constant voltage value towards the second voltage while continuing to detect the output signal of the sense amplifier until the control gate bias voltage reaches the second voltage.

9. The non-volatile memory device of claim 8, wherein the PMOS MTP flash memory cell is programmed by a program cell current being the cell current flowing through the memory cell, the program cell current having a maximum value determined by the first current value of the select gate drain current and a minimum value determined by the cell current limit.

10. The non-volatile memory device of claim 8, wherein the first current value of the select gate drain current comprises 7 µA and the cell current limit comprises 3 µA.

11. The non-volatile memory device of claim 8, further comprising a charge pump and a regulator circuit configured to generate bias voltages and currents in the memory device.

12. The non-volatile memory device of claim 11, wherein the charge pump and the regulator circuit are configured to bias a bit-line connected to a drain region of the select gate transistor to a first positive power supply voltage, to bias a source line connected to a source region of the floating gate transistor to a ground voltage, and to bias an N-well in which the select gate transistor and the floating gate transistor are formed to the first positive power supply voltage.

13. The non-volatile memory device of claim 12, wherein the control gate bias voltage is increased from a first voltage of 0V to a second voltage of 6V and the first positive power supply voltage comprises 6V.

14. The non-volatile memory device of claim 8, wherein the control gate bias controller is configured to increase the control gate bias voltage in a piece-wise linear fashion from the first voltage to the second voltage, the second voltage greater than the first voltage.

15. The non-volatile memory device of claim 8, wherein the memory cell to be programmed is programmed using hot carrier injection with the floating gate transistor being turned on during programming.

\* \* \* \* \*